United States Patent
Kim

(10) Patent No.: US 11,665,918 B2
(45) Date of Patent: May 30, 2023

(54) ORGANIC LIGHT EMITTING DEVICE HAVING AN OPTICAL DISTANCE OF A MICRO CAVITY AND METHOD OF FABRICATING THE SAME

(71) Applicant: LG DISPLAY CO., LTD., Seoul (KR)

(72) Inventor: Mina Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 204 days.

(21) Appl. No.: 16/242,756

(22) Filed: Jan. 8, 2019

(65) Prior Publication Data

US 2019/0148662 A1    May 16, 2019

Related U.S. Application Data

(62) Division of application No. 14/814,304, filed on Jul. 30, 2015, now Pat. No. 10,211,417.

(30) Foreign Application Priority Data

Oct. 31, 2014    (KR) .......................... 10-2014-0150304

(51) Int. Cl.
*H01L 51/50* (2006.01)
*H01L 27/32* (2006.01)
(Continued)

(52) U.S. Cl.
CPC ...... *H01L 51/5044* (2013.01); *H01L 27/3206* (2013.01); *H01L 27/3211* (2013.01); *H01L 51/504* (2013.01); *H01L 51/506* (2013.01); *H01L 51/5016* (2013.01); *H01L 51/5056* (2013.01); *H01L 51/5072* (2013.01); *H01L 51/5088* (2013.01); *H01L 51/5096* (2013.01);
(Continued)

(58) Field of Classification Search
CPC ............... H01L 51/5044; H01L 51/504; H01L 51/5096; H01L 51/5056; H01L 51/5088; H01L 51/506; H01L 51/5072; H01L 51/5265; H01L 27/3206
See application file for complete search history.

(56) References Cited

U.S. PATENT DOCUMENTS

5,707,745 A * 1/1998 Forrest ................... H01L 24/82
                                                      427/78
6,924,025 B2 * 8/2005 Humbs ............... H01L 51/0016
                                                      257/88
(Continued)

FOREIGN PATENT DOCUMENTS

CN    102856507 A    1/2013
JP    2012-38555 A   2/2012
(Continued)

*Primary Examiner* — M. A. Golub-Miller
(74) *Attorney, Agent, or Firm* — Birch, Stewart, Kolasch & Birch, LLP

(57) ABSTRACT

An OLED (Organic Light Emitting Diode) device can include a red emission layer, a green emission layer, and a blue emission layer which are non-patterned and stacked as common layers configured such that a thickness of each of a hole transporting layer, the red emission layer, the green emission layer, and the blue emission layer is respectively less than those corresponding layers in a conventional OLED device having a red emission layer, a green emission layer, and a blue emission layer which are patterned.

13 Claims, 8 Drawing Sheets

US 11,665,918 B2
Page 2

(51) Int. Cl.
  *H01L 51/52* (2006.01)
  *H01L 51/56* (2006.01)
(52) U.S. Cl.
  CPC .......... *H01L 51/5265* (2013.01); *H01L 51/56* (2013.01)

(56) References Cited

U.S. PATENT DOCUMENTS

| | | | | |
|---|---|---|---|---|
| 8,288,784 | B2* | 10/2012 | Cho | H01L 51/5036 313/500 |
| 9,065,052 | B2* | 6/2015 | Kim | H01L 27/3211 |
| 9,082,735 | B1 | 7/2015 | Sundararajan | |
| 9,640,591 | B2* | 5/2017 | Kim | H01L 51/0021 |
| 9,786,720 | B2* | 10/2017 | Kim | H01L 51/506 |
| 2005/0040392 | A1* | 2/2005 | Wu | H01L 51/5036 257/40 |
| 2006/0017377 | A1* | 1/2006 | Ryu | H01L 51/5265 313/504 |
| 2011/0248247 | A1* | 10/2011 | Matsumoto | H01L 51/504 438/35 |
| 2012/0112172 | A1* | 5/2012 | Kashiwabara | H01L 51/5265 438/35 |
| 2012/0261683 | A1* | 10/2012 | Sonoyama | H01L 27/3211 257/89 |
| 2013/0001612 | A1* | 1/2013 | Lee | H01L 51/56 257/40 |
| 2013/0002131 | A1* | 1/2013 | Inoue | C07F 15/0033 548/402 |
| 2013/0082246 | A1* | 4/2013 | Hasegawa | H01L 51/5265 257/89 |
| 2013/0140533 | A1* | 6/2013 | Lee | H01L 27/3218 257/40 |
| 2013/0240851 | A1* | 9/2013 | Seo | H01L 51/5088 257/40 |
| 2014/0054556 | A1* | 2/2014 | Park | H01L 51/5064 257/40 |
| 2014/0061604 | A1* | 3/2014 | Seo | H01L 51/0074 257/40 |
| 2014/0065750 | A1* | 3/2014 | Harikrishna Mohan | H01L 51/5088 438/35 |
| 2014/0084256 | A1* | 3/2014 | Kim | H01L 51/5088 257/40 |
| 2014/0117315 | A1* | 5/2014 | Kim | H01L 27/3211 257/89 |
| 2014/0131674 | A1* | 5/2014 | Park | H01L 51/5064 438/35 |
| 2014/0151658 | A1* | 6/2014 | Lee | H01L 27/3211 257/40 |
| 2014/0183482 | A1 | 7/2014 | Lee et al. | |
| 2014/0183493 | A1* | 7/2014 | Lee | H01L 51/5064 438/35 |
| 2014/0353635 | A1* | 12/2014 | Chou | H01L 51/504 257/40 |
| 2015/0144926 | A1* | 5/2015 | Lee | H01L 51/5265 257/40 |
| 2015/0171356 | A1* | 6/2015 | Nakamura | H01L 51/006 257/40 |
| 2015/0333296 | A1 | 11/2015 | Lee | |
| 2016/0013454 | A1 | 1/2016 | Lee et al. | |
| 2016/0359143 | A1* | 12/2016 | Osawa | H01L 51/5278 |
| 2017/0229669 | A1* | 8/2017 | Rausch | H01L 51/5044 |
| 2018/0138248 | A1* | 5/2018 | Maeda | H01L 51/5064 |
| 2019/0372060 | A1* | 12/2019 | Li | H01L 27/3244 |
| 2020/0006692 | A1* | 1/2020 | Seok | H01L 51/5004 |
| 2020/0035758 | A1* | 1/2020 | Kang | H01L 51/5265 |
| 2020/0044177 | A1* | 2/2020 | Kim | H01L 51/5278 |

FOREIGN PATENT DOCUMENTS

| JP | 2013-219024 A | 10/2013 |
|---|---|---|
| KR | 10-2012-0092507 A | 8/2012 |

\* cited by examiner

| Items | | Intensity | CIE_x | CIE_y |
|---|---|---|---|---|
| Red | Comparative Example | 1 | 0.658 | 0.340 |
| | Inventive Example | 1.71 | 0.659 | 0.339 |
| Green | Comparative Example | 1 | 0.257 | 0.710 |
| | Inventive Example | 1.02 | 0.259 | 0.709 |
| Blue | Comparative Example | 1 | 0.138 | 0.056 |
| | Inventive Example | 0.99 | 0.139 | 0.056 |

FIG. 4

|  | Unit | Comparative Example | Inventive Example |
|---|---|---|---|
| Driving Voltage for Red Emission | V | 5.1 | 4.6 |
| Emission Efficiency of Red light | cd/A | 54.3 | 92.8 |
| Power Consumption in White Emission | mW | 160 | 145 |

FIG. 5

ORGANIC LIGHT EMITTING DEVICE HAVING AN OPTICAL DISTANCE OF A MICRO CAVITY AND METHOD OF FABRICATING THE SAME

CROSS-REFERENCE TO RELATED APPLICATIONS

This application is a Divisional of U.S. application Ser. No. 14/814,304, filed on Jul. 30, 2015, which claims the priority benefit of Patent Application No. 10-2014-0150304 filed on Oct. 31, 2014 in the Republic of Korea, all of which are incorporated herein by reference into the present application.

BACKGROUND OF THE INVENTION

Field of the Invention

Embodiments of the present invention relate to an organic light emitting device and, more particularly, to an organic light emitting device capable of simplifying a manufacturing process, enhancing efficiency and reducing power consumption, and a method of fabricating the same.

Description of the Related Art

An organic light emitting diode (OLED) display is a self-luminous display employing an organic light emitting device. The organic light emitting device has an emission layer between an a cathode serving as an electron injection electrode and an anode serving as a hole injection electrode. The organic light emitting device receives electrons from the cathode and holes from the anode and injects the electrons and the holes into the emission layer. The injected electrons are combined with the injected holes to form excitons. The organic light emitting device emits light when the excitons transit from an excited state to a ground state.

OLED displays are classified into a top emission type, a bottom emission type, and a dual emission type according to emission directions of light from the OLEDs, and are also classified into a passive matrix type and an active matrix type according to manners in which the OLEDs are driven.

Contrary to the liquid crystal display (LCD), the OLED display requires no separate light source. Accordingly, a lightweight and thin OLED display can be fabricated. The OLED display is advantageous in terms of power consumption since the OLED display requires a low driving voltage. Moreover, the OLED display exhibits excellence in color expressions, response time, viewing angle and contrast ratio (CR). For these reasons, the OLED display is under research as a next generation display.

With development towards higher-definition displays, the number of pixels per unit area has increased, and higher brightness has been demanded. However, the OLED display has a limit on current (A) per unit area due to the emission structure of the OLED display. In addition, increasing the current applied to the organic light emitting device leads to lower reliability and increased power consumption of the organic light emitting device.

FIG. 1 is a view schematically illustrating the structure of an organic light emitting device 100 of the related art.

Referring to FIG. 1, the organic light emitting device 100 of the related art includes a first electrode 110 (anode) formed on a substrate on which a red sub-pixel area Rp, a green sub-pixel area Gp and a blue sub-pixel area Bp are defined, a hole injection layer (HIL) 115, a common hole transporting layer (common HTL) 120, a first hole transporting layer 125 (R-HTL), a second hole transporting layer 130 (G-HTL), organic emission layers including a red emission layer (red EML) 135, a green emission layer (green EML) 140 and a blue emission layer (blue EML) 145, an electron transporting layer (ETL) 150, a second electrode 155 (cathode), and a capping layer (CPL) 160.

As shown in FIG. 1, for the organic light emitting device 100, the red EML 135, the green EML 140 and the blue EML 145 are patterned on the red sub-pixel area Rp, the green sub-pixel area Gp and the blue sub-pixel area Bp respectively using a fine metal mask (FMM). As the organic emission layers are formed using the FMM as above, the fabrication process of the organic light emitting device becomes complex and productivity of the organic light emitting device is lowered.

In addition, emission efficiency of the organic light emitting device 100 may be improved by adjusting thicknesses of the first and second hole transporting layer 125 and 130 and the organic emission layers 135, 140 and 145 in the respective sub-pixel areas to produce a micro cavity effect. However, since a structure having a second-order optical distance is applied to all of the red sub-pixel area Rp, the green sub-pixel area Gp and the blue sub-pixel area Bp, the red EML 135 in the red sub-pixel area Rp becomes thicker than the green EML 140 in the green sub-pixel area Gp and the blue EML 145 in the blue sub-pixel area Bp.

Due to the thickness of the red EML 135 of the red sub-pixel area Rp formed as above, the driving voltage of the organic light emitting device 100 significantly increases along with an increase in power consumption.

Further, as the red EML 135 becomes relatively thick, an opening of a mask is clogged by organic material in the deposition process of the thick organic emission layer. This phenomenon is called mask rib. The mask rib leads to a poor organic light emitting device.

Accordingly, it is needed to overcome technological limitations on emission efficiency, lifetime and power consumption that deteriorate the quality and productivity of the OLED display. Currently, research is being widely conducted to develop an organic light emitting device which is capable of enhancing emission efficiency, lifetime of the organic emission layer and viewing angle while maintaining the color gamut.

SUMMARY OF THE INVENTION

Various structures of an organic light emitting device for enhancing efficiency and lifetime of the organic light emitting device and reducing power consumption of the organic light emitting device have been proposed to improve quality and productivity of an OLED display.

Embodiments of the present invention propose an organic light emitting device structure capable of simplifying a process, enhancing efficiency and reducing power consumption.

In view of the above, an object of the present invention is to provide an organic light emitting device capable of simplifying a process by reducing the number of FMMs used in forming organic emission layers on the organic light emitting device and a method of fabricating the same.

Another object of the present invention is to provide an organic light emitting device capable of improving emission efficiency by applying a structure having a first-order optical distance to at least one of a red sub-pixel area Rp, a green sub-pixel area Gp and a blue sub-pixel area Bp of the organic light emitting device and a method of fabricating the same.

Another object of the present invention is to provide an organic light emitting device capable of reducing power consumption by lowering the driving voltage and a method of fabricating the same.

It should be noted that objects of the present invention are not limited to the above-described objects, and other objects of the present invention will be apparent to those skilled in the art from the following descriptions.

Embodiments described herein provide an organic light emitting device capable of simplifying a manufacturing process, enhancing efficiency and reducing power consumption, and a method of fabricating the same.

In an embodiment of the present invention, an organic light emitting device includes a first electrode and a second electrode, and a red emission layer, a green emission layer and a blue emission layer positioned between the first electrode and the second electrode, wherein each of the red emission layer, the green emission layer and the blue emission layer is disposed in an entirety of a red sub-pixel area, a green sub-pixel area and a blue sub-pixel area, wherein a distance between the first electrode and the second electrode in at least one of the red sub-pixel area, the green sub-pixel area and the blue sub-pixel area is $\lambda/2n$, wherein $\lambda$ is a wavelength of light emitted from each of the sub-pixel areas, and n is an average refractive index of a plurality of organic material layers positioned between the first electrode and the second electrode in each of the sub-pixel areas.

The green emission layer may be disposed on the red emission layer, and the blue emission layer may be disposed on the green emission layer in correspondence with each of the sub-pixel areas.

A red light may emit in the red sub-pixel area, a green light may emit in the green sub-pixel area and a blue light may emit in the blue sub-pixel area.

The organic light emitting device may further include a hole transporting layer corresponding to an entirety of the red sub-pixel area, green sub-pixel area and blue sub-pixel area and positioned below the red emission layer, the green emission layer and the blue emission layer, wherein a thickness of the hole transporting layer may be equal to or less than 1200 Å.

The distance between the first electrode and the second electrode in the red sub-pixel area may be $\lambda/2n$, wherein $\lambda$ may be the wavelength of light emitted from the red sub-pixel area, and n may be the average refractive index of the plurality of organic material layers disposed between the first electrode and the second electrode in the red sub-pixel area.

A first hole transporting layer may be positioned on the red emission layer in the green sub-pixel area.

The first hole transporting layer may include at least one of an electron blocking layer, a hole injection layer and a hole transporting layer doped with a p-dopant.

A second hole transporting layer may be positioned on the green emission layer in the blue sub-pixel area.

The second hole transporting layer may include at least one of an electron blocking layer, a hole injection layer and a hole transporting layer doped with a p-dopant.

A thickness of each of the red emission layer, the green emission layer and the blue emission layer may be between 50 Å and 500 Å.

A total thickness of the plurality of organic material layers positioned between the first electrode and the second electrode may be less than or equal to 2000 Å in the at least one of the red sub-pixel area, the green sub-pixel area and the blue sub-pixel area, in which the distance between the first electrode and the second electrode is $\lambda/2n$ (e.g., the thickness of the organic light emitting device can be smaller than a human red blood cell, small bacteria and some viruses).

In another embodiment of the present invention, a method of fabricating an organic light emitting device includes forming a first electrode, a hole injection layer, a hole transporting layer and a red emission layer each corresponding to an entirety of a red sub-pixel area, a green sub-pixel area and a blue sub-pixel area on a substrate, forming a first hole transporting layer on the red emission layer in the green sub-pixel area, forming a green emission layer corresponding to the entirety of the red sub-pixel area, the green sub-pixel area and the blue sub-pixel area, forming a second hole transporting layer on the green emission layer in the blue sub-pixel area, forming a blue emission layer corresponding to the entirety of the red sub-pixel area, the green sub-pixel area and the blue sub-pixel area, and forming an electron transporting layer, a second electrode and a capping layer on the blue emission layer.

Forming each of the first hole transporting layer and the second hole transporting layer comprise forming at least one of an electron blocking layer, a hole injection layer and a hole transporting layer doped with a p-dopant in each of the first hole transporting layer and the second hole transporting layer.

In another aspect of the present invention, an apparatus comprises an OLED device having a red emission layer, a green emission layer, and a blue emission layer which are non-patterned and stacked as common layers configured such that a thickness of each of a hole transporting layer, the red emission layer, the green emission layer, and the blue emission layer is respectively less than those corresponding layers in a conventional OLED device having a red emission layer, a green emission layer, and a blue emission layer which are patterned.

The common layers may comprise a red sub-pixel area, a green sub-pixel area and a blue sub-pixel area, and the OLED device may emit a red light in the red sub-pixel area, a green light in the green sub-pixel area and a blue light in the blue sub-pixel area.

The red sub-pixel area of the OLED device may comprise the red emission layer, the green emission layer disposed on the red emission layer, and the blue emission layer disposed on the green emission layer.

The green sub-pixel area of the OLED device may comprise the red emission layer, a first hole transporting layer disposed on the red emission layer, the green emission layer disposed on the first hole transporting layer, and the blue emission layer disposed on the green emission layer.

The first hole transporting layer may comprise at least one of an electron blocking layer, a hole injection layer and a hole transporting layer doped with a p-dopant.

The blue sub-pixel area of the OLED device may comprise the red emission layer, the green emission layer disposed on the red emission layer, a second hole transporting layer disposed on the green emission layer, and the blue emission layer disposed on the second hole transporting layer.

The second hole transporting layer may comprise at least one of an electron blocking layer, a hole injection layer and a hole transporting layer doped with a p-dopant.

According to embodiments of the present invention, by forming a red emission layer, a green emission layer and a blue emission layer as common layers corresponding to the entirety a red sub-pixel area Rp, green sub-pixel area Gp and blue sub-pixel area Bp of an organic light emitting device, the number of fine metal masks (FMMs) used to form the organic emission layers can be reduced, and a manufacturing process can be simplified.

In addition, emission efficiency of an organic light emitting device may be improved by causing a red sub-pixel area Rp or at least one of the red sub-pixel area Rp, a green sub-pixel area Gp and a the blue sub-pixel area Bp to have a first-order optical distance.

Further, a driving voltage of an organic light emitting device may be lowered by applying a first-order optical distance to at least one sub-pixel area. Thereby, power consumption of the organic light emitting device may be reduced.

It should be noted that effects of the present invention are not limited to those described above and other effects of the present invention will be apparent to those skilled in the art from the following descriptions.

It is to be understood that both the foregoing general description and the following detailed description of the present invention are exemplary and explanatory and are not intended to specify essential limitations recited in the claims. Therefore, the scope of the claims is not restricted by the foregoing general description and the following detailed description of the present invention.

BRIEF DESCRIPTION OF THE DRAWINGS

The above and other aspects, features and other advantages of the present invention will be more clearly understood from the following detailed description taken in conjunction with the accompanying drawings, in which:

FIG. 4 illustrates an evaluation result of electro-optical properties of an organic light emitting device according to an embodiment of the present invention; and FIG. 5 illustrates an evaluation result for properties of a panel including an organic light emitting device according to an embodiment of the present invention.

DETAILED DESCRIPTION OF THE PREFERRED EMBODIMENTS

Figure 1:
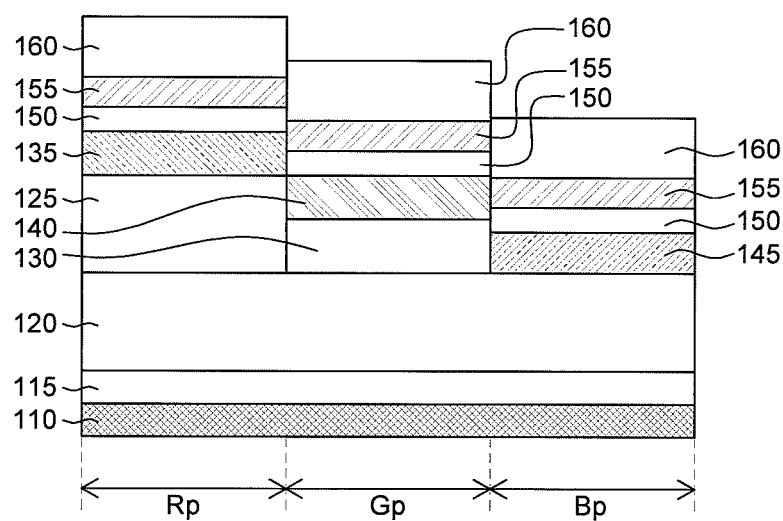
FIG. 1 schematically illustrates the structure of an organic light emitting device of the related art.

Advantages and features of the present invention and methods to achieve them will become apparent from the descriptions of embodiments herein below with reference to the accompanying drawings. However, the present invention is not limited to embodiments disclosed herein but may be implemented in various different forms. The embodiments are provided for making the disclosure of the present invention thorough and for fully conveying the scope of the present invention to those skilled in the art. It is to be noted that the scope of the present invention is defined only by the claims.

The figures, dimensions, ratios, angles, numbers of elements given in the drawings are merely illustrative and are not limiting. Like reference numerals denote like elements throughout the descriptions. Further, in describing the present invention, descriptions on well-known technologies may be omitted in order not to obscure the gist of the present invention. It is to be noticed that the terms "comprising," "having," "including" and so on, used in the description and claims, should not be interpreted as being restricted to the means listed thereafter unless specifically stated otherwise. Where an indefinite or definite article is used when referring to a singular noun, e.g. "a," "an," "the," this includes a plural of that noun unless specifically stated otherwise.

In describing elements, the elements are interpreted as including error margins even without explicit statements. In describing positional relationships, such as "an element A on an element B," "an element A above an element B," "an element A below an element B" and "an element A next to an element B," another element C may be disposed between the elements A and B unless the term "directly" or "immediately" is explicitly used.

The terms first, second, third and the like in the descriptions and in the claims are used for distinguishing between similar elements and not necessarily illustrating a sequential or chronological order. These terms are used to merely distinguish one element from another. Accordingly, as used herein, a first element may be a second element within the technical idea of the present invention.

Features of various embodiments of the present invention may be combined partially or totally. As will be clearly appreciated by those skilled in the art, technically various interactions and operations are possible. Various embodiments can be practiced individually or in combination.

Hereinafter, embodiments of the present invention will be described in detail with reference to the accompanying drawings.

Figure 2:
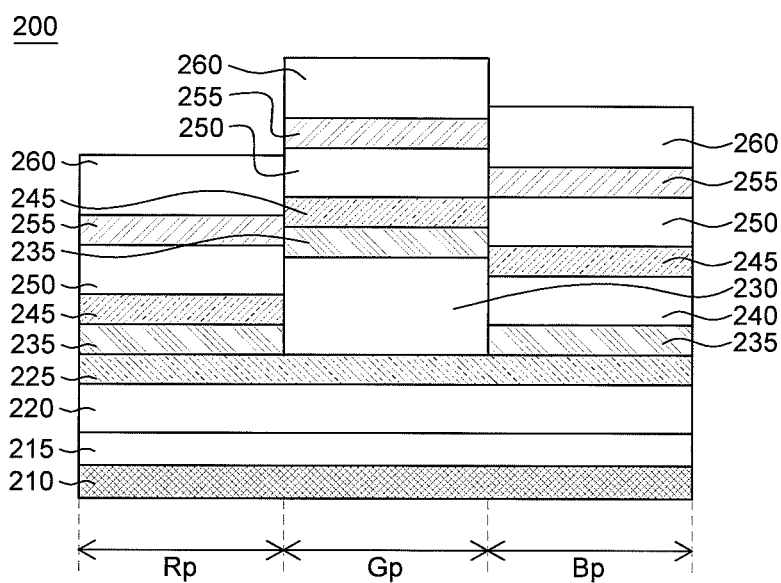
FIG. 2 schematically illustrates the structure of an organic light emitting device according to an embodiment of the present invention.

FIG. 2 schematically illustrates the structure of an organic light emitting device 200 according to an embodiment of the present invention.

Referring to FIG. 2, the organic light emitting device 200 includes a first electrode 210 (anode) formed on a substrate on which a red sub-pixel area Rp, a green sub-pixel area Gp and a blue sub-pixel area Bp are defined, a hole injection layer (HIL) 215, a common hole transporting layer (common HTL) 220, a red emission layer (red EML) 225, a first hole transporting layer 230 (G-HTL), a green emission layer (green EML) 235, a second hole transporting layer 240 (B-HTL), a blue emission layer (blue EML) 245, an electron transporting layer (ETL) 250, a second electrode 255 (cathode), and a capping layer (CPL) 260.

In addition, an OLED display including the organic light emitting device 200 can include a gate line, a data line, and a power line. The gate line and data line are disposed on the substrate to cross each other to define each sub-pixel area, and the power line is disposed to extend in parallel with one of the gate line and the data line. A switching thin film transistor (TFT) connected to the gate line and a data line and a driving TFT connected to the switching TFT are disposed in each sub-pixel area. The driving TFT is connected to the first electrode 210 (anode).

The first electrode 210 may be disposed on the substrate to correspond to all the red, green and blue sub-pixel areas Rp, Gp and Bp which are defined on the substrate. The first electrode 210 may be a reflective electrode.

For example, the first electrode 210 may include a transparent conductive material layer formed of a material having a relatively high work function, such as indium-tin-oxide (ITO), and a reflective material layer formed of a material such as silver (Ag) or an Ag alloy.

The HIL 215 is formed to correspond to all of the red, green and blue sub-pixel areas Rp, Gp and Bp and disposed on the first electrode 210.

The HTL 220 may be formed by adding a p-dopant to a material constituting the HIL 215. In this instance, the HIL 215 and the HTL 220 may be formed in a continuous process performed by one processing equipment.

The HIL 215 serves to facilitate injection of holes. The HIL 215 may be formed of at least one selected from a group consisting of HATCN (1,4,5,8,9,11-hexaazatriphenylene-hexanitrile), CuPc (copper phthalocyanine), PEDOT (poly(3,4)-ethylenedioxythiophene), PANI (polyaniline) and NPD (N,N-dinaphthyl-N,N'-diphenylbenzidine), but embodiments of the present invention are not limited thereto.

The common HTL 220 is formed to correspond to all of the red, green and blue sub-pixel areas Rp, Gp and Bp and disposed on the HIL 215.

The common HTL 220 serves to facilitate transport of holes. The common HTL 220 may be formed of at least one selected from a group consisting of NPD (N,N-dinaphthyl-N,N'-diphenylbenzidine), TPD (N,N'-bis-(3-methylphenyl)-N,N'-bis-(phenyl)-benzidine), s-TAD and MTDATA (4,4',4"-Tris(N-3-methylphenyl-N-phenyl-amino)-triphenylamine), but embodiments of the present invention are not limited thereto.

For the organic light emitting device 200, the red EML 225 is formed as a common layer corresponding to the entirety of the red, green and blue sub-pixel areas Rp, Gp and Bp and disposed on the common HTL 220.

The red EML 225 may contain a luminescent material emitting red light. The luminescent material may employ a phosphorescent material or a fluorescent material.

More specifically, the red EML 225 may contain a host material, which includes CBP (carbazole biphenyl) or mCP (1,3-bis(carbazol-9-yl). The red EML 225 may be formed of a phosphorescent material including a dopant, which includes at least one selected from a group consisting of PIQIr(acac)(bis(1-phenylisoquinoline)acetylacetonate iridium), PQIr(acac)(bis(1-phenylquinoline)acetylacetonate iridium), PQIr(tris(1-phenylquinoline)iridium) and PtOEP (octaethylporphyrin platinum). Alternatively, the red EML 225 may be formed of a fluorescent material including PBD:Eu(DBM)3(Phen) or Perylene, but embodiments of the present invention are not limited thereto.

The first hole transporting layer 230 included in the organic light emitting device 200, is disposed on the red EML 225 and formed to correspond to the green sub-pixel area Gp.

The first hole transporting layer 230 may perform the function of the first HTL (G-HTL) formed in the green sub-pixel area Gp. The first hole transporting layer 230 may be formed in the green sub-pixel area Gp to define an optical distance of a micro cavity.

The first hole transporting layer 230 serves to facilitate transport of holes. The first hole transporting layer 230 may be formed of at least one selected from a group consisting of NPD (N,N-dinaphthyl-N,N'-diphenylbenzidine), TPD (N,N'-bis-(3-methylphenyl)-N,N'-bis-(phenyl)-benzidine), s-TAD and MTDATA (4,4',4"-Tris(N-3-methylphenyl-N-phenyl-amino)-triphenylamine), but embodiments of the present invention are not limited thereto.

The first hole transporting layer 230 may include at least one of an electron blocking layer (EBL), the HIL 215 and the HTL 220 doped with a p-dopant.

The EBL, not shown, functions to enhance emission efficiency of the organic light emitting device by preventing electrons from flowing over to the HTL 220 such that holes are smoothly recombined with the electrons in the organic emission layers.

The first hole transporting layer 230 including the EBL may block electrons from being transferred from the second electrode 255 to the red EML 225, thereby ensuring that desired light can be emitted from the green EML 235 in the green sub-pixel area Gp (e.g., blocking electrons from combining with holes in the red EML 222). For example, the green sub-pixel area can emit only green light while not emitting blue light and not emitting red light.

The first hole transporting layer 230 including the HIL 215 or the HTL 220 doped with the p-dopant may inject holes into the green EML 235 adjacent thereto, thereby causing desired light to be emitted from the green EML 235 in the green sub-pixel area Gp.

The green EML 235 included in the organic light emitting device 200 is formed as a common layer corresponding to the entirety of the red, green and blue sub-pixel areas Rp, Gp and Bp and disposed on the red EML 225 and the first hole transporting layer 230.

The green EML 235 may contain a luminescent material emitting green light. The luminescent material may employ a phosphorescent material or a fluorescent material.

The green EML 235 may contain a host material including CBP or mCP. The green EML 235 may be formed of a phosphorescent material including a dopant material such as Ir complex including Ir(ppy)3(fac tris(2-phenylpyridine) iridium). Alternatively, the green EML 235 may be formed of a fluorescent material including Alq3(tris(8-hydroxyquinolino)aluminum), but embodiments of the present invention are not limited thereto.

The second hole transporting layer 240 included in the organic light emitting device 200 is disposed on the green EML 235 and formed to correspond to the blue sub-pixel area Bp.

The second hole transporting layer 240 may perform the function of the second HTL (B-HTL) formed in the blue sub-pixel area Bp, The second hole transporting layer 240 may be formed in the blue sub-pixel area Bp to define an optical distance of a micro cavity.

The second hole transporting layer 240 serves to facilitate the transport of holes. The second hole transporting layer 240 may be formed of at least one selected from a group consisting of NPD (N,N-dinaphthyl-N,N'-diphenylbenzidine), TPD (N,N'-bis-(3-methylphenyl)-N,N'-bis-(phenyl)-benzidine), s-TAD and MTDATA (4,4',4"-Tris(N-3-methylphenyl-N-phenyl-amino)-triphenylamine), but embodiments of the present invention are not limited thereto.

The second hole transporting layer 240 may include at least one of a EBL, the HIL 215 and the HTL 220 doped with a p-dopant.

The second hole transporting layer 240 including the EBL may block electrons from being transferred from the second electrode 255 to the red EML 225 and the green EML 235, thereby ensuring that desired light can be emitted from the blue EML 245 in the blue sub-pixel area Bp (e.g., electrons and holes can only combine within the blue EML 245 while only holes pass through the red EML 225 and the green EML 235). For example, the blue sub-pixel area can emit only blue light while not emitting green light and not emitting red light.

The second hole transporting layer 240 including the HIL 215 or the HTL 220 doped with the p-dopant may inject holes into the blue EML 245 adjacent thereto, thereby causing desired light to be emitted from the blue EML 245 in the blue sub-pixel area Bp.

The blue EML 245 included in the organic light emitting device 200 is formed as a common layer corresponding to the entirety of the red, green and blue sub-pixel areas Rp, Gp and Bp, and disposed on the green EML 235 and the second hole transporting layer 240.

The blue EML 245 may contain a luminescent material emitting blue light. The luminescent material may employ a phosphorescent material or a fluorescent material.

The blue EML 245 may contain a host material including CBP or mCP. The blue EML 245 may be formed of a phosphorescent material including a dopant material including (4,6-F2ppy)2Irpic. Alternatively, the blue EML 245 may be formed of a fluorescent material a fluorescent material including at least one selected from a group consisting of spiro-DPVBi, spiro-6P, distyrylbenzene (DSB), distyrylarylene (DSA), a PFO-based polymer and a PPV-based polymer, but embodiments of the present invention are not limited thereto.

In an embodiment of the invention, the green emission layer is disposed on the red emission layer, and the blue emission layer is disposed on the green emission layer in each of the sub-pixel areas, and even though each sub-pixel area includes the red, green and blue emission layers, only red light can emit in the red sub-pixel area, only green light can emit in the green sub-pixel area and only blue light can emit in the blue sub-pixel area. For example, the red sub-pixel area can emit only red light while not emitting green and not emitting blue light, the green sub-pixel area can emit only green light while not emitting red light and not emitting blue light, and the blue sub-pixel area can emit only blue light while not emitting green light and not emitting red light.

The ETL 250 is formed to correspond to all of the red, green and blue sub-pixel areas Rp, Gp and Bp and is disposed on the blue EML 245.

The ETL 250 may serve to transport and inject electrons. The thickness of the ETL 250 may be adjusted in consideration of an electron transport property.

The ETL 250 functions to facilitate transport of electrons. The ETL 250 may be formed of at least one selected from a group consisting of Alq3(tris(8-hydroxyquinolino)aluminum), PBD(2-(4-biphenylyl)-5-(4-tert-butylpheny)-1,3,4oxadiazole), TAZ, Spiro-PBD, BAlq and SAlq, but embodiments of the present invention are not limited thereto.

A separate electron injection layer (EIL), not shown, may be added to the ETL 250.

The EIL may employ Alq3(tris(8-hydroxyquinolino)aluminum), PBD(2-(4-biphenylyl)-5-(4-tert-butylpheny)-1,3,4oxadiazole), TAZ, Spiro-PBD, BAlq or SAlq, but embodiments of the present invention are not limited thereto.

Herein, the structure is not limited according to embodiments of the present invention. At least one of the HIL 215, the HTL 220, the ETL 250 and the EIL may be omitted. In addition, any one of the HIL 215, the HTL 220, the ETL 250 and the EIL may include two or more layers.

The second electrode 255 is disposed on the ETL 250. The second electrode 255 may be formed of, for example, an alloy (Mg:Ag) of magnesium (Mg) and silver (Ag) and thus may have a semi-transparent property. That is, light emitted from the organic emission layer is externally displayed through the second electrode 255, and a part of the light returns to the first electrode 210 since the second electrode 255 has the semi-transparent property.

As such, repeated reflection occurs between the first electrode 210 and the second electrode 255 acting as reflective layers, which is called a micro cavity effect (e.g., an optical resonator for particular wavelengths). As light is repeatedly reflected in the cavity between the first electrode 210 and the second electrode 255, light emission efficiency increases.

Alternatively, the first electrode 210 may be formed as a transmissive electrode, and the second electrode 255 may be formed as a reflective electrode, such that light emitted from the organic emission layer is externally displayed through the first electrode 210.

The CPL 260 is disposed on the second electrode 255. The CPL 260 is intended to boost the light extraction effect of the organic light emitting device 200. The CPL 260 may be formed of one of the materials of the HTL 220 and the ETL 250 and the host materials of the red EML 225, the green EML 235 and the blue EML 245. Alternatively, the CPL 260 may be omitted.

Regarding the organic light emitting device structure, in order to produce the micro cavity effect with light of different wavelengths generated in the respective sub-pixel areas constituting one pixel, the cavity length or depth of the organic light emitting device generating different emission wavelengths may become a multiple of the wavelength of each emitted light. In this instance, emission efficiency may be improved as the generated light is amplified within the micro cavity length.

To obtain the micro cavity effect as above, a condition of $m\lambda=2nd$ is satisfied. In other words, to obtain the micro cavity effect, the distance between the first electrode and the second electrode, namely the micro cavity length d is set to an integer multiple m of $\lambda/2n$. Herein, m denotes an order, $\lambda$ denotes the wavelength of light emitted from each sub-pixel area, n denotes an average refractive index of a plurality of organic material layers disposed between the first electrode and the second electrode in each sub-pixel area, and d denotes a distance between the first electrode and the second electrode, namely a micro cavity length. The plurality of organic material layers disposed between the first electrode and the second electrode may include an HIL, an HTL, an organic EML, an ETL, and an EIL, but embodiments of the present invention are not limited thereto.

When the micro cavity length d is equal to the wavelength of the emitted light (i.e., m=1), the organic light emitting device is called an organic light emitting device having a first-order optical distance. When the micro cavity length d is twice the wavelength of the emitted light (i.e., m=2), the organic light emitting device is called an organic light emitting device having a second-order optical distance.

The organic light emitting device 100 illustrated in FIG. 1 includes the red EML 135, the green EML 140 and the blue EML 145 disposed respectively in the red sub-pixel area Rp, the green sub-pixel area Gp and the blue sub-pixel area Bp between the first electrode 110 and the second electrode 155. The organic light emitting device 100 is structured to have a second-order optical distance d between the first electrode 110 and the second electrode 155 in all the sub-pixel areas. That is, the second-order optical distance d is twice the wavelength of emitted light (i.e., m=2), namely $\lambda/n$.

In other words, efficiency of the organic light emitting device 100 may be improved by achieving the micro cavity by adjusting the thicknesses of the first and second hole transporting layers 125 and 130 and the organic EMLs 135, 140 and 145. However, in this instance, as structures having a second-order distance are applied to all of the red, green, and blue sub-pixel areas Rp, Gp and Bp, the red EML 135 in the red sub-pixel area Rp becomes thicker than the green EML 140 in the green sub-pixel area Gp and the blue EML 145 in the blue sub-pixel area Bp.

As the red EML 135 in the red sub-pixel area Rp is formed to be relatively thick, the driving voltage of the organic light emitting device 100 significantly increases along with an increase in power consumption.

Further, as the red EML 135 becomes relatively thick, an opening of a mask is clogged by organic materials in the deposition process of the thick organic emission layer. This phenomenon is called mask rib. The mask rib leads to a poor organic light emitting device.

Compared to the structure of the organic light emitting device 100 of the related art, the organic light emitting device 200 may be formed to have a first-order optical distance in the red sub-pixel area Rp by reducing the thicknesses of the HTL 220 and the red EML 225.

According to one embodiment of the present invention, in order to ensure that the organic light emitting device 200 has a first-order optical distance in the red sub-pixel area Rp, the HTL 220 may be formed such that the thickness is less than or equal to 1200 Å.

According to one embodiment of the present invention, the total thickness of a plurality of organic material layers disposed between the first electrode 210 and the second electrode 255 may be less than or equal to 2000 Å in the red sub-pixel area Rp in which the organic light emitting device 200 has a first-order optical distance. The plurality of organic material layers disposed between the first electrode 210 and the second electrode 255 may include an HIL, an HTL, an organic EML, an ETL and an EIL, but embodiments of the present invention are limited thereto.

Each of the red EML 225, the green EML 235 and the blue EML 245 may be formed to have a thickness within a range of 50 Å to 500 Å such that the organic light emitting device 200 has a first-order optical distance in the red sub-pixel area Rp.

While the organic light emitting device has been described as having a first-order optical distance in the red sub-pixel area Rp, embodiments of the present invention are not limited thereto. The organic light emitting device may have a first-order optical distance in at least one of the red, green and blue sub-pixel areas Rp, Gp and Bp, and the total thickness of a plurality of organic material layers disposed between the first electrode 210 and the second electrode 255 may be less than or equal to 2000 Å in the at least one sub-pixel area in which the first-order optical distance is defined.

That is, the organic light emitting device 200 is structured to have a first-order optical distance d between the first electrode 210 and the second electrode 255 in the red sub-pixel area Rp which is equal to the wavelength of the emitted light (i.e., m=1), namely λ/2n.

As the organic light emitting device 200 is structured to have a first-order optical distance in the red sub-pixel area Rp, emission efficiency of the organic light emitting device 200 may be improved for red light, compared to the emission efficiency of the organic light emitting device 100 of the related art.

In addition, as the thicknesses of the HTL 220 and the red EML 225 are reduced to define the first-order optical distance in the red sub-pixel area Rp, the organic light emitting device may be driven with a lower driving voltage, and power consumption in the organic light emitting device may be reduced.

Further, reducing the thickness of the red EML 225 may prevent a poor organic light emitting device from being produced by the mask rib, which refers to clogging of an opening of a mask caused by organic matter when a thick organic EML is deposited.

FIGS. 3A to 3D are cross-sectional views schematically illustrating a method of fabricating the organic light emitting device 200 described above with reference to FIG. 2.

Hereinafter, a method of fabricating the organic light emitting device 200 will be described in detail with reference to FIGS. 3A to 3D.

Figure 3A:
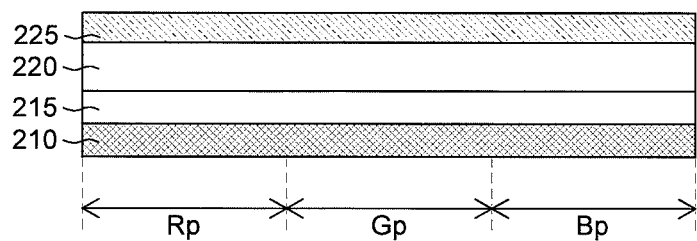
FIGS. 3A to 3D are cross-sectional views schematically illustrating a method of fabricating an organic light emitting device according to an embodiment of the present invention.

Referring to FIG. 3A, a first electrode 210, an HIL 215, an common HTL 220 and a red EML 225 are formed to correspond to the entirety of a red sub-pixel area Rp, a green sub-pixel area Gp and a blue sub-pixel area Bp, which are defined on a substrate.

Figure 3B:
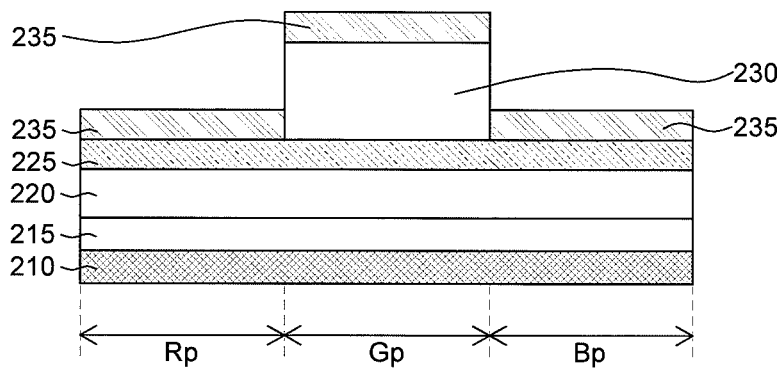

Next, referring to FIG. 3B, the first hole transporting layer 230 is formed on the red EML 225 in the green sub-pixel area Gp.

Next, a green EML 235 is formed on the red EML 225 and the first hole transporting layer 230 to correspond to the entirety of the red, green and blue sub-pixel areas Rp, Gp and Bp.

Figure 3C:
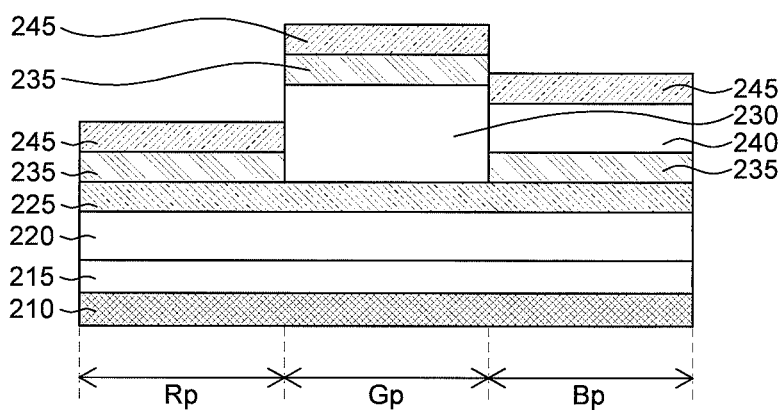

Next, referring to FIG. 3C, a second hole transporting layer 240 is formed on the green EML 235 in the blue sub-pixel area Bp.

Next, a blue EML 245 is formed on the green EML 235 and the second hole transporting layer 240 to correspond to the entirety of the red, green and blue sub-pixel areas Rp, Gp and Bp.

Figure 3D:
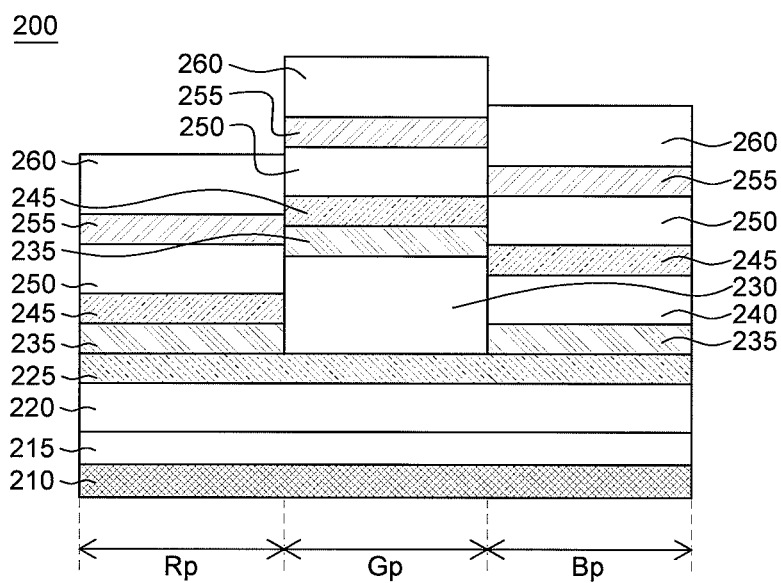

Next, referring to FIG. 3D, an ETL 250, a second electrode 255 and a CPL 260 are formed on the blue EML 245 to correspond to the red, green and blue sub-pixel areas Rp, Gp and Bp.

With a fabrication method according to the structure of the organic light emitting device 100, FMMs are needed to form first hole transporting layer 125, second hole transporting layer 130, red EML 135, green EML 140 and blue EML 145. Thereby, use of five FMMs is required.

With the fabrication method according to the structure of the organic light emitting device 200, the red EML 225, the green EML 235 and the blue EML 245 are formed as common layers corresponding to the entirety of the red, green and blue sub-pixel areas Rp, Gp and Bp, and therefore they need no FMM. Thereby, an organic light emitting device can be fabricated by using only two FMMs to form the first hole transporting layer 230 and the second hole transporting layer 240.

In other words, as the red EML 225, the green EML 235 and the blue EML 245 of the organic light emitting device 200 are formed as common layers corresponding to the entirety of the red sub-pixel area Rp, the green sub-pixel area Gp and the blue sub-pixel area Bp, the number of masks used to form the organic EMLs can be reduced and the process of fabricating the organic light emitting device can be simplified.

FIG. 4 illustrates an evaluation result of electro-optical properties of the organic light emitting device 200 according to an embodiment of the present invention.

In FIG. 4, the Comparative Example (related art) represents an evaluation result of electro-optical properties of the organic light emitting device 100 described above with reference to FIG. 1.

And the Embodiment (present invention) represents an evaluation result of electro-optical properties of the organic light emitting device 200 described above with reference to FIG. 2.

FIG. 4 illustrates spectral intensities of red, green and blue light emitted from organic light emitting devices according to the Comparative Example and the Embodiment. For emission of the green and blue light, the intensities obtained in the Embodiment are not significantly different from the intensity in the Comparative Example. For emission of red light, the intensity obtained in the Comparative Example is 1, whereas the intensity in the Embodiment of the present invention is 1.71. Therefore, it can be seen from FIG. 4 that the emission efficiency of red light in the Embodiment about 1.7 times the emission efficiency of red light in the Comparative Example.

Regarding color coordinates, FIG. 4 shows that the coordinates obtained in the Embodiment are similar to those obtained in the Comparative Example (e.g., CIE_x and CIE_y). Accordingly, it can be seen from FIG. 4 that Embodiment satisfies desired color characteristics similar to that of Comparative Example.

In other words, with the organic light emitting device 200, improved emission efficiency of red light may be obtained by applying a structure having a first-order distance to the red sub-pixel area Rp.

FIG. 5 illustrates an evaluation result of panel properties of a panel including the organic light emitting device 200 according to an embodiment of the present invention.

In FIG. 5, the Comparative Example represents an evaluation result of panel properties of a panel including the organic light emitting device 100 of the related art described above with reference to FIG. 1.

The Embodiment (present invention) shown in FIG. 5 represents an evaluation result of panel properties of a panel including the organic light emitting device 200 described above with reference to FIG. 2.

Regarding driving voltages for red emission from the organic light emitting device according to the Comparative Example and the Embodiment illustrated in FIG. 5, the Comparative Example requires about 5.1 V as a driving voltage for red emission, whereas the Embodiment requires about 4.6 V as a driving voltage for red emission. Accordingly, the organic light emitting device 200 can be driven by a driving voltage which is about 0.5 V lower than the driving voltage of the Comparative Example. Thereby, reduction in driving voltage can be achieved with the organic light emitting device 200.

Regarding emission efficiency of red light from OLED displays including the organic light emitting devices according to the Comparative Example and the Embodiment, FIG. 5 shows that the Comparative Example achieves an efficiency corresponding to 54.3 cd/A, and the Embodiment achieves an efficiency corresponding to 92.8 cd/A. Accordingly, the organic light emitting device 200 may obtain an emission efficiency of red light improved by 38.5 cd/A from the efficiency obtained in the Comparative Example.

Regarding power consumption in white emission from OLED displays including the organic light emitting devices according to the Comparative Example and the Embodiment, it can be seen from FIG. 5 that the Comparative Example requires power consumption of about 160 mW for white emission of a brightness level, whereas the Embodiment has a power consumption of 145 mW for white emission of the same brightness level. In other words, the Embodiment has a power consumption that is 10% lower than the power consumption of the Comparative Example. That is, an OLED display including the organic light emitting device 200 can be improved in terms of power consumption.

According to an embodiment of the present invention, the red EML 225, the green EML 235 and the blue EML 245 of the organic light emitting device 200 may be formed as common layers each corresponding to the entirety of the red, green and blue sub-pixel areas Rp, Gp and Bp. Thereby, the number of FMMs used in forming organic EMLs may be reduced and the fabrication process may be simplified.

According to an embodiment of the present invention, the organic light emitting device 200 may improve emission efficiency with a structure that has a first-order optical distance applied to at least one of the red, green and blue sub-pixel areas Rp, Gp and Bp.

According to an embodiment of the present invention, with the organic light emitting device 200, an OLED may be improved in terms of power consumption by reducing the driving voltage through application of a structure having a first-order optical distance.

Embodiments of the present invention have been described in detail above with reference to the accompanying drawings. Those skilled in the art will appreciate that the present invention is not limited to the embodiments, and various modifications and variations can be made in the present invention without departing from the spirit or scope of the invention. Accordingly, the embodiments described herein are merely illustrative and are not intended to limit the scope of the present invention. The technical ideas of the present invention are not limited by the embodiments. Therefore, the embodiments described herein should be construed in all aspects as illustrative and not restrictive. The scope of protection sought by the present invention should be determined by the appended claims and their legal equivalents, and all changes coming within the meaning and equivalency range of the appended claims are intended to be embraced therein.

What is claimed is:

1. An OLED (Organic Light Emitting Diode) device comprising:
   a substrate including a red sub-pixel area, a green sub-pixel area and a blue sub-pixel area;
   a first electrode and a second electrode on the red sub-pixel area, the green sub-pixel area and the blue sub-pixel area of the substrate;
   a red emission layer, a green emission layer, and a blue emission layer between the first electrode and the second electrode;
   a common hole transporting layer disposed between the first electrode and the red emission layer and disposed in an entirety of the red sub-pixel area, the green sub-pixel area and the blue sub-pixel area;
   a first hole transporting layer disposed between the red emission layer and the green emission layer in the green sub-pixel area; and
   a second hole transporting layer disposed between the green emission layer and the blue emission layer in the blue sub-pixel area,
   wherein each of the red emission layer, the green emission layer, and the blue emission layer is formed without using a patterning mask and is disposed in the entirety of the red sub-pixel area, the green sub-pixel area and the blue sub-pixel area,
   wherein the red emission layer in each of the red, green and blue sub-pixel areas is disposed at a same height with respect to the first electrode,
   wherein the green emission layer in the red sub-pixel area directly contacts both of the blue emission layer in the red sub-pixel area and the red emission layer in the red sub-pixel area,
   wherein the blue emission layer in the green sub-pixel area directly contacts the green emission layer in the green sub-pixel area, and the green emission layer in the green sub-pixel area is spaced apart from the red emission layer in the green sub-pixel area, and wherein the blue emission layer in the blue sub-pixel area is spaced apart from the green emission layer in the blue sub-pixel area, and the green emission layer in the blue sub-pixel area directly contacts the red emission layer in the blue sub-pixel area.

2. The OLED device of claim 1, wherein the OLED device emits a red light in the red sub-pixel area, a green light in the green sub-pixel area and a blue light in the blue sub-pixel area.

3. The OLED device of claim 1, wherein each of the first hole transporting layer and the second hole transporting layer comprises at least one of a hole injection layer and a hole transporting layer doped with a p-dopant.

4. The OLED device of claim 1, wherein the common hole transporting layer in each of the red, green and blue sub-pixel areas is disposed at a same height with respect to the first electrode.

5. The OLED device of claim 1, wherein the red emission layer corresponding to the red sub-pixel area, the red emission layer corresponding to the green sub-pixel area and the red emission layer corresponding to the blue sub-pixel area are continuously disposed on a same plane of the common hole transporting layer.

6. The OLED device of claim 1, wherein the red emission layer in the red sub-pixel area is in direct contact with the red emission layer in the green sub-pixel area, and
wherein the red emission layer in the green sub-pixel area is in direct contact with the red emission layer in the blue sub-pixel area.

7. The OLED device of claim 1, wherein an uppermost surface of the blue emission layer in the blue sub-pixel area is disposed at a height relative to the first electrode that is lower than a lowermost surface of the blue emission layer in the green sub-pixel area and higher than an uppermost surface of the blue emission layer in the red sub-pixel area.

8. The OLED device of claim 1, wherein a side surface of the green emission layer in the green sub-pixel area directly contacts a side surface of the blue emission layer in the blue sub-pixel area.

9. The OLED device of claim 1, wherein the first hole transporting layer in the green sub-pixel directly contacts the green and blue emission layers in the red sub-pixel area, and the first hole transporting layer in the green sub-pixel directly contacts the green and blue emission layers in the blue sub-pixel area.

10. The OLED device of claim 1, wherein the blue emission layers in the red, green and blue sub-pixel areas are disposed at different heights.

11. An OLED (Organic Light Emitting Diode) device comprising:

a red sub-pixel area, a green sub-pixel area and a blue sub-pixel area disposed on a substrate;
a first electrode and a second electrode on the red sub-pixel area, the green sub-pixel area and the blue sub-pixel area of the substrate;
a red emission layer, a green emission layer, and a blue emission layer between the first electrode and the second electrode;
a common hole transporting layer disposed between the first electrode and the red emission layer and disposed in an entirety of the red sub-pixel area, the green sub-pixel area and the blue sub-pixel area; and
a first hole transporting layer disposed between the red emission layer and the green emission layer in the green sub-pixel area,
wherein each of the red emission layer, the green emission layer, and the blue emission layer is disposed in the entirety of the red sub-pixel area, the green sub-pixel area and the blue sub-pixel area,
wherein the red emission layer in each of the red, green and blue sub-pixel areas is disposed at a same height with respect to the first electrode,
wherein the first hole transporting layer directly contacts the red and green emission layers in the green sub-pixel area,
wherein the green emission layer in the red sub-pixel area directly contacts both of the blue emission layer in the red sub-pixel area and the red emission layer in the red sub-pixel area,
wherein the blue emission layer in the green sub-pixel area directly contacts the green emission layer in the green sub-pixel area, and the green emission layer in the green sub-pixel area is spaced apart from the red emission layer in the green sub-pixel area, and
wherein the blue emission layer in the blue sub-pixel area is spaced apart from the green emission layer in the blue sub-pixel area, and the green emission layer in the blue sub-pixel area directly contacts the red emission layer in the blue sub-pixel area.

12. The OLED device of claim 11, wherein the common hole transporting layer in each of the red, green and blue sub-pixel areas is disposed at a same height with respect to the first electrode.

13. The OLED device of claim 11, further comprising:
a second hole transporting layer disposed between the green emission layer and the blue emission layer in the blue sub-pixel area,
wherein the second hole transporting layer directly contacts the green and blue emission layers in the blue sub-pixel area.

* * * * *